(12) United States Patent
Gao

(10) Patent No.: US 11,832,423 B2
(45) Date of Patent: *Nov. 28, 2023

(54) LIQUID COOLING UNIT FOR PERIPHERAL DEVICES

(71) Applicant: BAIDU USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 91 days.

This patent is subject to a terminal disclaimer.

(21) Appl. No.: 17/210,067

(22) Filed: Mar. 23, 2021

(65) Prior Publication Data

US 2022/0312642 A1   Sep. 29, 2022

(51) Int. Cl.
  *H05K 7/20*   (2006.01)
(52) U.S. Cl.
  CPC ..... *H05K 7/20781* (2013.01); *H05K 7/20272* (2013.01)
(58) Field of Classification Search
  CPC ........... H05K 7/20254; H05K 7/20272; H05K 7/20781
  See application file for complete search history.

(56) References Cited

U.S. PATENT DOCUMENTS

| | | | |
|---|---|---|---|
| 6,393,853 B1 | 5/2002 | Vukovic et al. | |
| 10,842,043 B1 | 11/2020 | Zhang et al. | |
| 10,966,354 B1 | 3/2021 | Shao et al. | |
| 2005/0128705 A1* | 6/2005 | Chu | H01L 23/473 361/689 |
| 2010/0002393 A1 | 1/2010 | Campbell et al. | |
| 2010/0085712 A1* | 4/2010 | Hrehor, Jr | H05K 7/20254 361/699 |
| 2010/0252234 A1 | 10/2010 | Campbell et al. | |
| 2011/0013359 A1* | 1/2011 | Goldrian | H01L 23/473 361/679.54 |
| 2015/0160702 A1* | 6/2015 | Franz | G06F 1/20 361/679.47 |
| 2019/0182988 A1* | 6/2019 | Lunsman | H05K 7/20272 |
| 2020/0337181 A1* | 10/2020 | Tian | H05K 1/0203 |

FOREIGN PATENT DOCUMENTS

| | | |
|---|---|---|
| JP | 2005191473 A | 7/2005 |
| JP | 2018029094 A | 2/2018 |

\* cited by examiner

*Primary Examiner* — Jacob R Crum
(74) *Attorney, Agent, or Firm* — WOMBLE BOND DICKINSON (US) LLP

(57) ABSTRACT

A cooling unit to deliver liquid cooling to one or more peripheral devices is disclosed. The cooling unit includes one or more first mounting structures, the one or more first mounting structures are mounted onto the cooling unit, where the one or more first mounting structures are movable along a first direction. The cooling unit includes one or more cooling devices mounted to the one or more first mounting structures, where each of the one or more cooling devices is coupled to the one or more liquid distribution channels to receive cooling liquid to cool one or more peripheral devices of a server system. The cooling unit includes one or more liquid distribution channels to distribute cooling liquid within the server system, between the server system and other server systems, and/or between the server system and a liquid distribution system of an electronic rack.

20 Claims, 12 Drawing Sheets

LIQUID COOLING UNIT FOR PERIPHERAL DEVICES

FIELD OF THE INVENTION

Embodiments of the present invention relate generally to server and data center cooling. More particularly, embodiments of the invention relate to a liquid cooling unit for peripheral devices.

BACKGROUND

Generally, computing motherboard includes various interfaces to exchange data with various components. Such interfaces include a peripheral component interconnect (PCI), which accepts a peripheral printed circuit board (PCB). The peripheral PCB (or peripheral devices) is generally smaller than the motherboard and may include electronic devices such as, e.g., graphics processing units (GPU), cryptographic accelerators, application specific integrated circuits (ASIC), high computing based IC chips or chiplets, and so forth. Various standards may be used with a peripheral component interconnect, such as, PCI, PCI-X, AGP, PCIe (PCI express), etc. The commonality of these standards is that they all enable intercommunication between components mounted on the motherboard and components mounted on the peripheral PCB, with different speeds.

With the increase in modern computational requirements, more and more tasks are offloaded from the main CPU to other components, including components mounted on the peripheral PCB. Peripheral device is a commonly used solution for heterogeneous computing. Peripheral devices can include different types of accelerator chips, application specific integrated circuits and so on. Consequently, the processing power of the peripheral PCB increases, which increase the demand for energy, thus increasing heat dissipation, which results in more challenges in thermal management.

With the more diverse workload and the computing architecture becoming more heterogenous, a liquid cooling thermal management solution is needed that is interoperable with different server system designs and peripheral PCB configurations.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
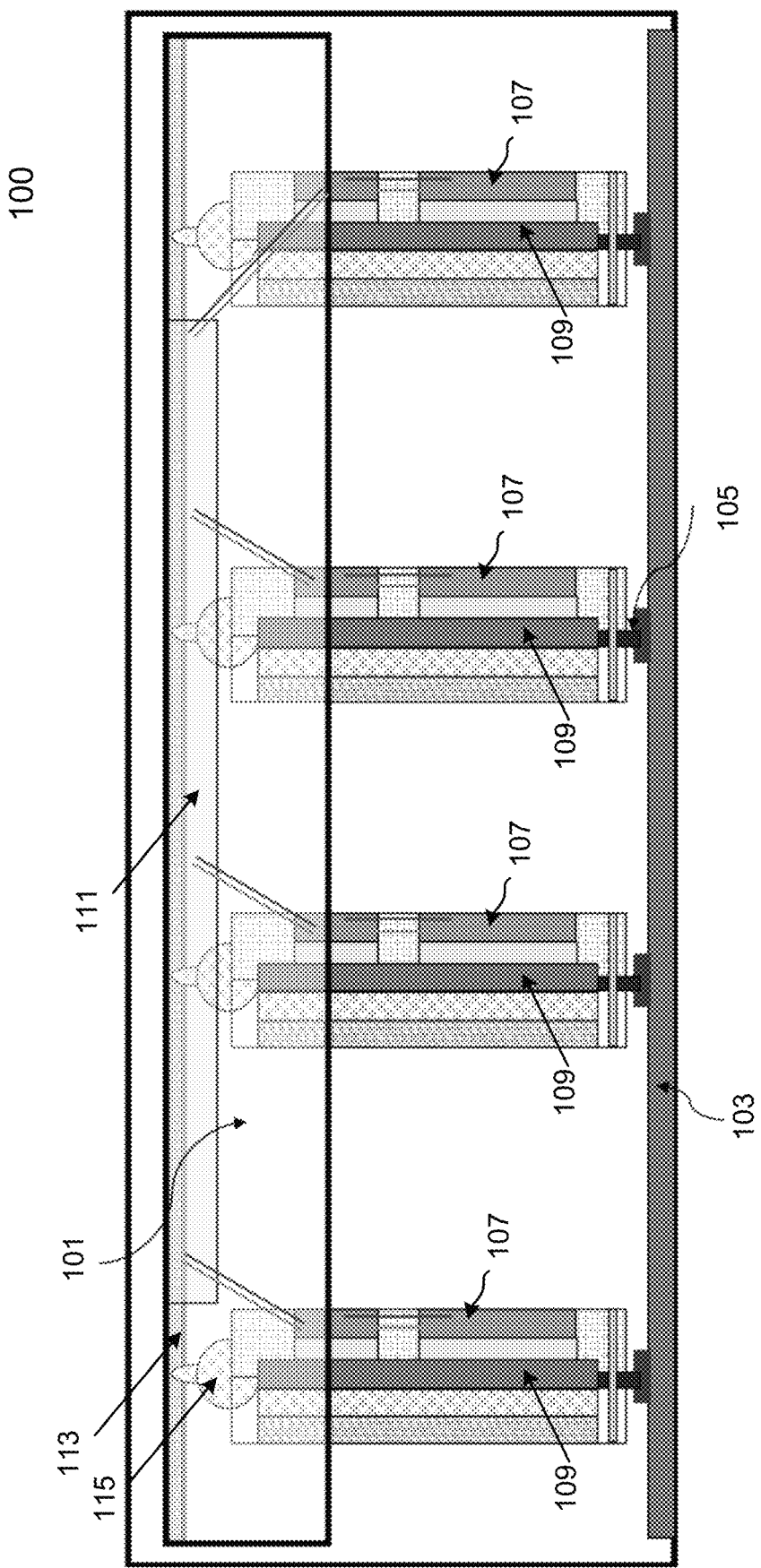
FIG. 1 is a block diagram illustrating an example of a server system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide a modular cooling unit and a server chassis containing one or more modular cooling units to support various peripheral arrangements. Each modular cooling unit can include two layers of movable mounting structures to mount to liquid/fluid cooling devices. The mobility of the two layers of mounting structures accommodate different types of liquid loop arrangements to distribute cooling liquid to the modular cooling unit. Thus, a server chassis is reconfigurable, using one or more modular cooling unit, to accommodate different server system configurations.

According to a first aspect, a cooling unit includes one or more liquid distribution channels to distribute warm liquid to a rack manifold of an electronic rack and cooling liquid from the rack manifold of the electronic rack. The cooling unit includes one or more first mounting structures, the one or more first mounting structures are mounted onto the cooling unit, where the one or more first mounting structures are movable along a first direction. The cooling unit includes one or more cooling devices mounted to the one or more first mounting structures, where each of the one or more cooling devices include a liquid cooling plate interfaced to one or more peripheral devices of a server system, where the liquid cooling plate is coupled to the one or more liquid distribution channels to receive cooling liquid to cool the one or more peripheral devices and to return warm liquid to the one or more liquid distribution channels.

In one embodiment, each of the one or more liquid distribution channels overlap one of the one or more first mounting structures. In one embodiment, the cooling unit further includes: one or more second mounting structures that are mountable onto the one or more first mounting structures, where the one or more first mounting structures are situated at a first plane and the one or more second mounting structures are situated at a second plane different from the first plane.

In one embodiment, each of the one or more second mounting structures is movable along a length of the one or more first mounting structures, where the one or more second mounting structures are mounted, either perpendicular or parallel, onto the length of the one or more first mounting structures. In one embodiment, each of the one or more cooling devices are mountable onto the one or more first mounting structures or the one or more second mounting structures.

In one embodiment, each of the one or more peripheral devices is sandwiched by the one or more cooling devices. The peripheral devices can be part of a server system and can include multiple heterogeneous processors or chips. In one embodiment, the one or more peripheral devices are hot pluggable peripheral devices and a cooling device coupled to a peripheral device is removable from the server system while the server system is in operation.

In one embodiment, a cooling device includes a first planar portion and a second planar portion, where the second planar portion is foldable onto the first planar portion, where the cooling device is to fold onto either a first mounting structure or a second mounting structure using the first and second planar portions to secure the cooling device to either the first or second mounting structure.

In one embodiment, a first or a second mounting structure includes a flexible extension, where a peripheral package coupled to the second mounting structure is flexibly extendable to a peripheral slot. In one embodiment, the one or more liquid distribution channels is coupled, in parallel or in series, to one or more liquid distribution channels of another cooling unit.

According to a second aspect, a server chassis includes a tray secured to the server chassis to contain one or more peripheral devices, where the server chassis is stackable in a stack on an electronic rack. The server chassis includes a cooling unit coupled to the server chassis. The cooling unit includes one or more liquid distribution channels to distribute hot liquid to a rack manifold of an electronic rack and cooling liquid from the rack manifold. The cooling unit includes one or more first mounting structures, the one or more first mounting structures are mounted onto the cooling unit, where the one or more first mounting structures are movable along a first direction. The first cooling unit includes one or more cooling devices mounted to the one or more first mounting structures, where each of the one or more cooling devices include a liquid cooling plate interfaced to the one or more peripheral devices, where the liquid cooling plate is coupled to the one or more liquid distribution channels to receive a cooling liquid to cool the one or more peripheral devices (e.g., PCB of peripheral devices) and to return warm liquid to the one or more liquid distribution channels.

According to a third aspect, an electronic rack includes a rack manifold having a rack liquid supply line to receive first cooling liquid from a cooling liquid source and a rack liquid return line to return first warmer liquid back to the cooling liquid source. The electronic rack includes a number of server chassis arranged in a stack. Each server chassis includes a tray secured to the server chassis to contain one or more peripheral devices and a cooling unit coupled to the server chassis. The cooling unit includes one or more liquid distribution channels to distribute warm liquid to the rack manifold and cooling liquid from the rack manifold. The cooling unit includes one or more first mounting structures, the one or more first mounting structures are mounted onto the cooling unit, where the one or more first mounting structures are movable along a first direction. The cooling unit includes one or more cooling devices mounted to the one or more first mounting structures, where each of the one or more cooling devices include a liquid cooling plate interfaced to the one or more peripheral devices, where the liquid cooling plate is coupled to the one or more liquid distribution channels to receive cooling liquid to cool the one or more peripheral devices and to return warm liquid to the one or more liquid distribution channels.

FIG. 1 is a block diagram illustrating an example of a server system 100 according to one embodiment. System 100 can represent a host server or a compute server placed on a shelf of an electronic rack. In one embodiment, system 100 can be placed in a server chassis which is placed on a shelf of electronic rack. As shown in FIG. 1, system 100 can include a liquid cooling unit (or simply cooling unit) 101, cooling devices 107, peripheral devices PCB 109, and main PCB board 103 having one or more peripheral connectors 105. Main PCB board 103 can represent a motherboard of a server system. The server system can be a host server or a compute server. The host server (having one or more CPUs, and one or more peripheral cards) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, a host server distributes the tasks to one or more compute servers (having one or more peripheral cards) managed by the host server. The compute servers perform the actual tasks, which may generate heat during the operations.

Server system can include one or more electronic components (e.g., central processing units or CPUs, peripheral cards, general/graphic processing units (GPUs), memory, and/or storage devices, etc.). Each electronic component may perform data processing tasks, where the electronic component may include software installed in a storage device, loaded into the memory, and executed by one or more processors to perform the data processing tasks. In one embodiment, one or more electronic components can include one or more peripheral devices. In one embodiment, the one or more peripheral devices are hot pluggable peripheral devices, e.g., peripheral devices that can be removed or added while server system is in operation.

Referring to FIG. 1, in one embodiment, cooling unit 101 can be a main rectangular-shaped planar structure, where one or more cooling devices can be assembled to. Cooling unit 101 can function as a cooling liquid distributor that houses one or more cooling devices. Cooling unit 101 can include liquid (or fluid) distribution channel 111 to distribute cooling liquids to one or more cooling devices 107. Cooling unit 101 can include mounting structures 113-115 to assemble to cooling devices 107. Mounting structures 113-115 can position a peripheral package (e.g., peripheral device PCB 109 and cooling device 107) to be interfaced with peripheral connectors 105.

Cooling unit 101 can be secured to a panel (top panel or side panel) of a server chassis that contains server system 100. In some embodiments, cooling unit 101 can be secured to an electronic rack or server system 100.

As shown in FIG. 1, cooling unit 101 can fully contain a liquid distribution system (e.g., one or more distribution channels 111) that can distribute cooling liquid from external sources (e.g., rack manifold 1225 of FIG. 13) to cooling devices 107 and return warm liquid from cooling devices 107 to external sources.

Figure 2:
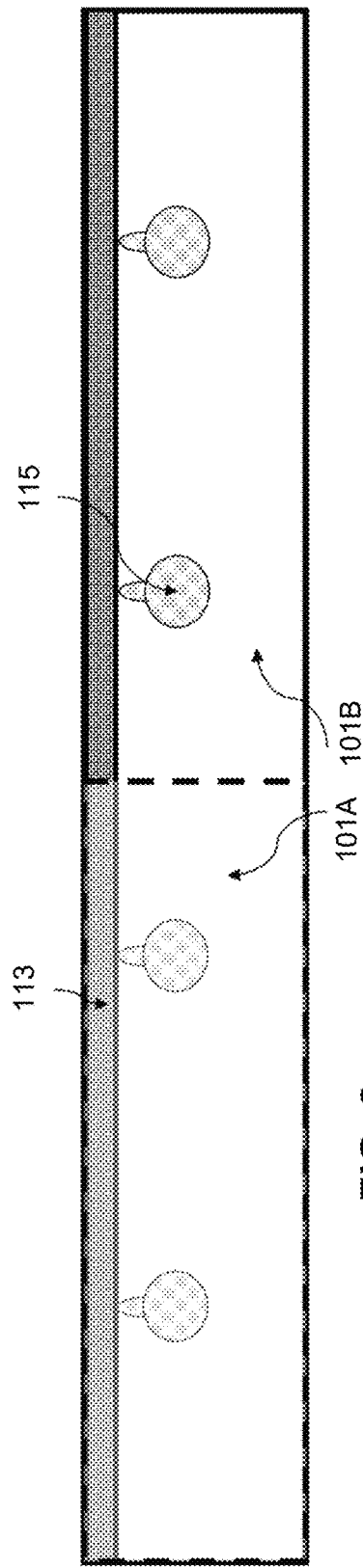
FIG. 2 is a front view of cooling units according to one embodiment.
Figure 3:
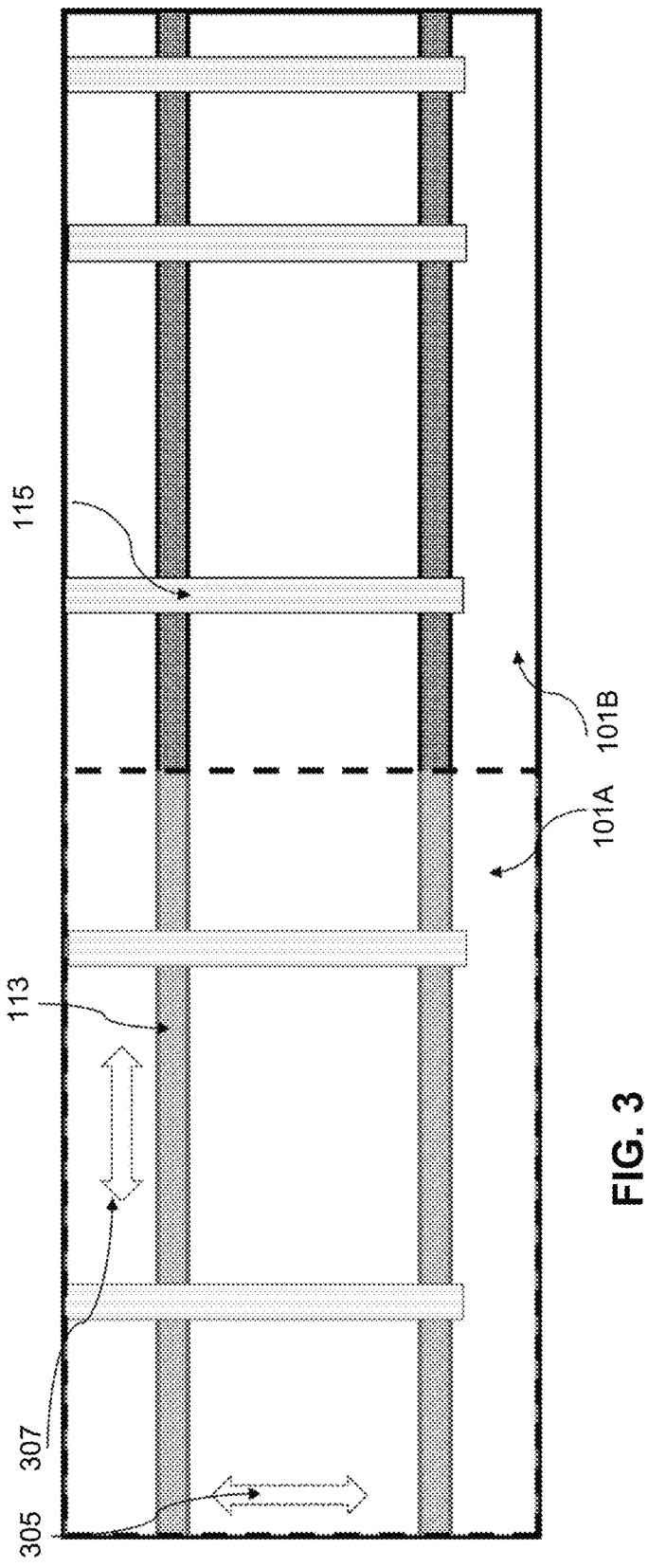
FIG. 3 is a side view of cooling units according to one embodiment.

FIG. 2 is a front view of cooling units 101A-B according to one embodiment. FIG. 3 is a side view of cooling units 101A-B of FIG. 2. As shown in FIGS. 2-3, cooling units 101A-101B can be modular units. For example, cooling unit 101A can be coupled with cooling unit 101B for a larger form factor. The coupling link between cooling unit 101A and cooling unit 101B can be a male-female coupling mechanism, or any other coupling techniques. For example, unit 101A has a female side which can slidably mate with a male side of unit 101B. Although two cooling units are shown, any number of cooling units, can be coupled together to obtain a cooling unit of a larger form factor.

Referring to FIGS. 2-3, cooling unit 101A or 101B can include two layers of mounting structures 113-115. In one embodiment, mounting structures 113 are coupled to cooling unit 101A or 101B, and mounting structures 115 are coupled perpendicularly to mounting structures 113.

In some embodiments, mounting structures 113 have mobility in directions 305, and mounting structures 115 have mobility in directions 307. In one embodiment, mounting structures 113 are situated in a first plane and have mobility on the first plane and mounting structures 115 are situated in a second plane and have mobility on the second plane. Since mounting structures 113 can be situated in a plane different from mounting structures 115, mounting structures 113 have mobility, independent of mounting structures 115. Such a design enable mounting structures 115 to be installed onto mounting structures 113 directly, and mounting structures 113 of a cooling unit can be assembled with mounting structures 113 of other cooling units to accommodate different use cases, as further illustrated in FIGS. 9-12.

In some embodiments, cooling units 101A-B can include different numbers of mounting structures 113-115. The mobility of mounting structures 113-115 can provide different mounting locations on cooling units 101A-B for a cooling device to assemble to. In some embodiments, cooling units 101A-B and/or mounting structures 113-115 can include one or more railings. In this case, mounting structures 113-115 can be moved to desired positions along the one or more railings of cooling units 101A-B and/or mounting structures 113-115 and a locking mechanism can secure mounting structures 113-115 at the desired positions. Thus, the mobility of mounting structures 113-115 and the ability to include any numbers of mounting structures 113-115 allow cooling units 101A-B to interface with cooling devices at any location on planar axes of cooling units 101A-B. Although only locks and railings are discussed, other mechanisms can be used to secure mounting structures 113-115 to cooling units 101A-B.

Figure 4:
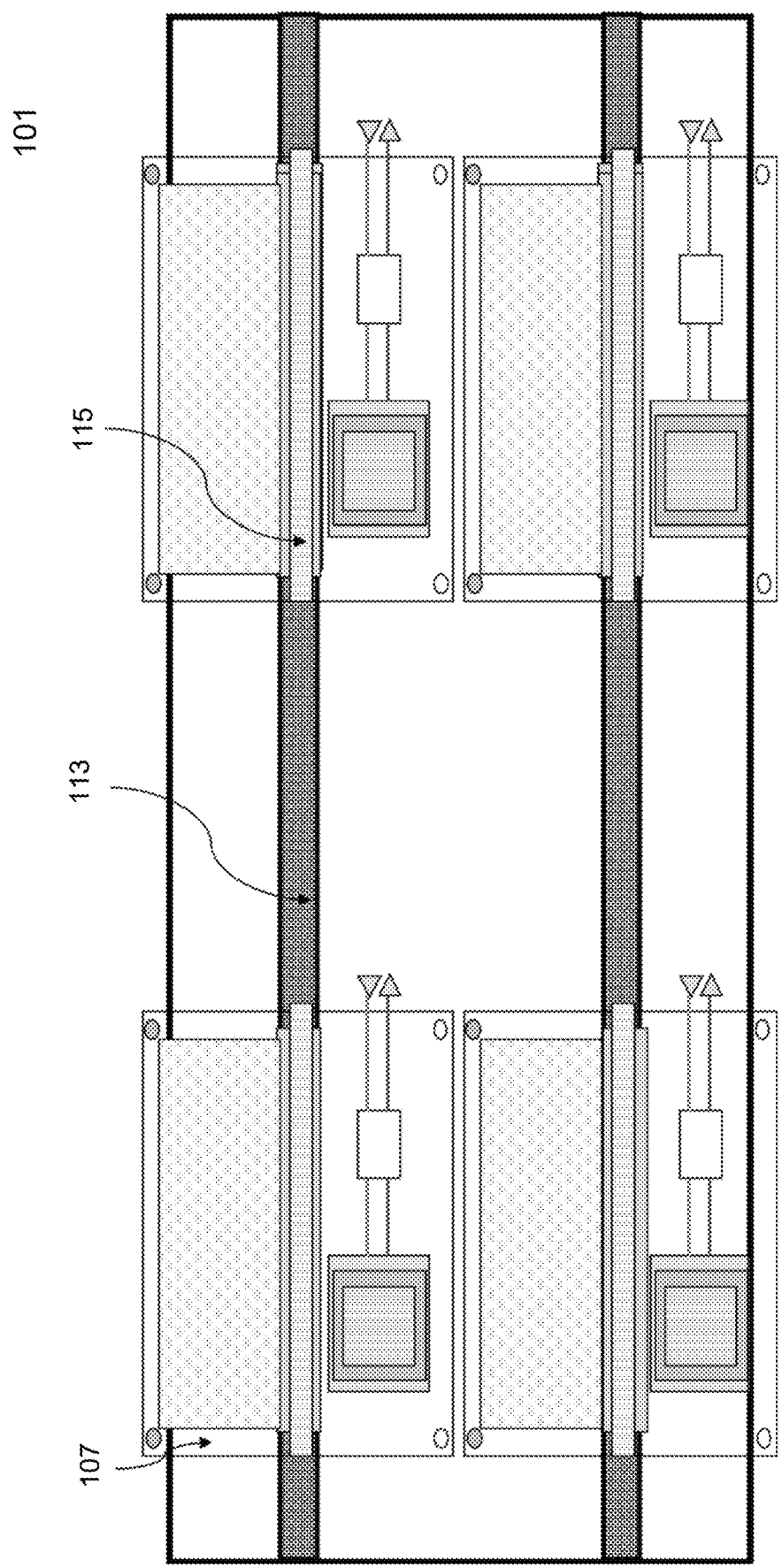
FIG. 4 is a top view of a cooling unit integrated with several cooling devices in a particular configuration according to one embodiment.

FIG. 4 is a top view of a cooling unit 101 integrated with several cooling devices in a particular configuration according to one embodiment. As shown in FIG. 4, cooling unit 101 includes mounting structures 113-115. Mounting structures 113 are situated in a first plane and mounting structures 115 are situated in a second plane, where mounting structures 115 are assembled in parallel with mounting structures 113.

In one embodiment, four cooling devices 107 are attached to cooling unit 101 through mounting structures 115. In one embodiment, mounting structures 115 can be preassembled or co-fabricated with cooling device 107. In one embodiment, a cooling device 107 can include two parts, which when folded onto a mounting structure 115, secures the cooling device to mounting structure 115. The folding mechanism is further illustrated in FIG. 7.

Figure 5:
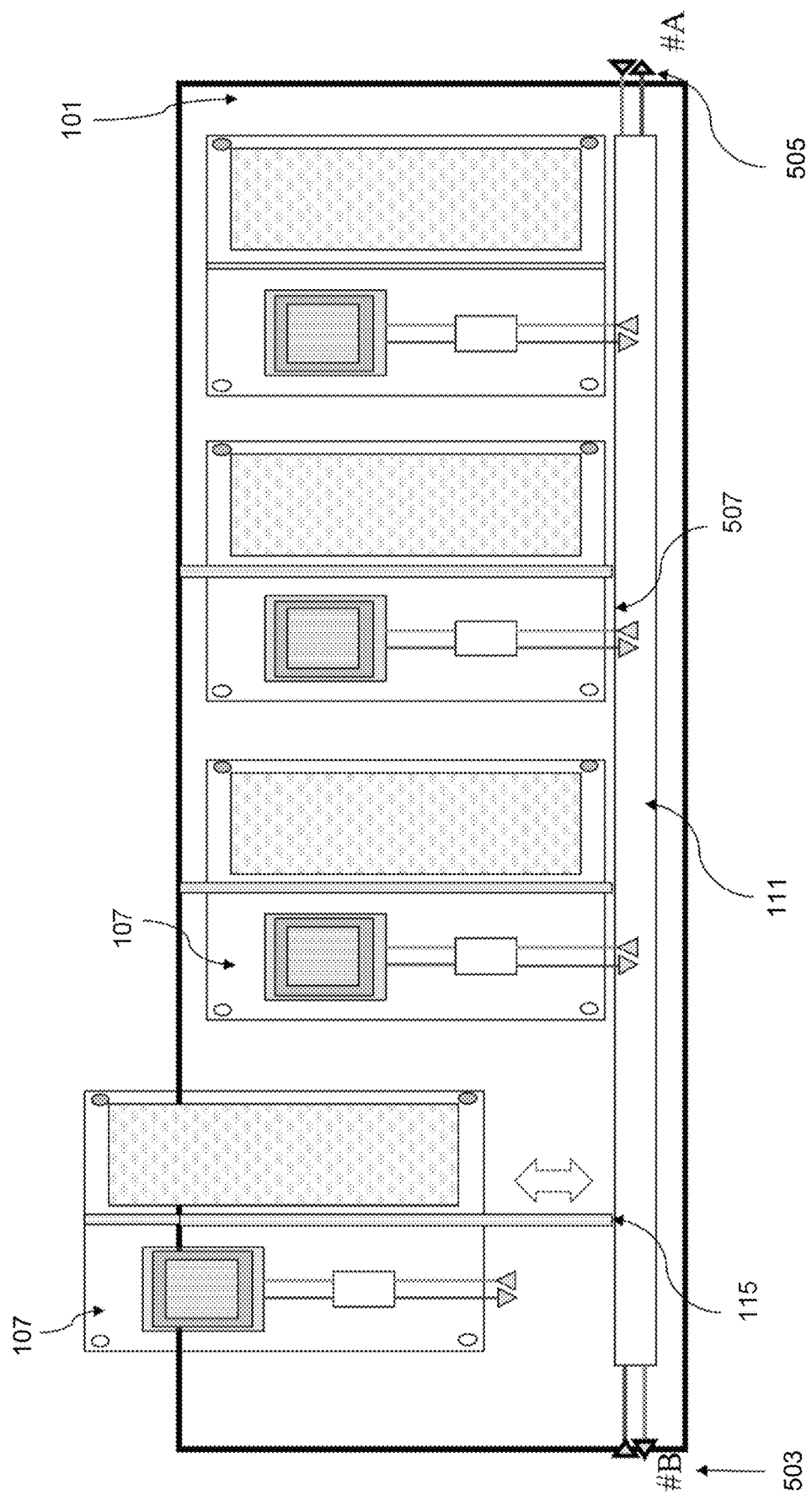
FIG. 5 is a top view of a cooling unit integrated with several cooling devices illustrating a modular design according to one embodiment.

FIG. 5 is a top view of a cooling unit 101 integrated with several cooling devices illustrating a modular design according to one embodiment. In one embodiment, cooling unit 101 can be coupled directly to mounting structures 115. As shown in FIG. 5, cooling devices 107 are attached onto cooling unit 101 through mounting structures 115, without a need for mounting structures 113.

In one embodiment, cooling unit 101 can include liquid distribution channels 111. Liquid distribution channels 111 can be a separate module attachable to cooling unit 101 or integrated to cooling unit 101. In one embodiment, liquid distribution channels 111 can include two distribution loops, a first loop to distribute cooling liquid and a second loop to distribute warm liquid. Liquid distribution channels 111 can include one or more connector ports 507 to establish connections with liquid connectors of cooling devices 107.

In one embodiment, channels 111 can include liquid port #A 505 and liquid port #B 503 with male and female connector configurations to support a modular arrangement. For example, port #A 505 can include a female warm liquid connector and a male cooling liquid connector. Port #B 503 can include a male warm liquid connector and a female cooling liquid connection. Port #A 505 of cooling unit 101 can connect to a port #B of another cooling unit. Cooling unit 101 can further be identified with sides #a and #b. Such an identification and male/female connectors configurations allow cooling unit 101 to couple to other cooling unit, in series or in parallel. In some embodiments, channels 111 can be implemented with different shapes, e.g., U-shapes, L-shapes, etc. In some embodiments, sides #a can be placed on an adjacent side of cooling unit 101, instead of directly across from side #b. With the different variations in port placements, cooling unit 101 can be connected to other cooling units for intra-system connections (e.g., within a server chassis) or inter-system connection (between server chassis), in series or in parallel, as further illustrated in FIGS. 9-12.

Figure 6:
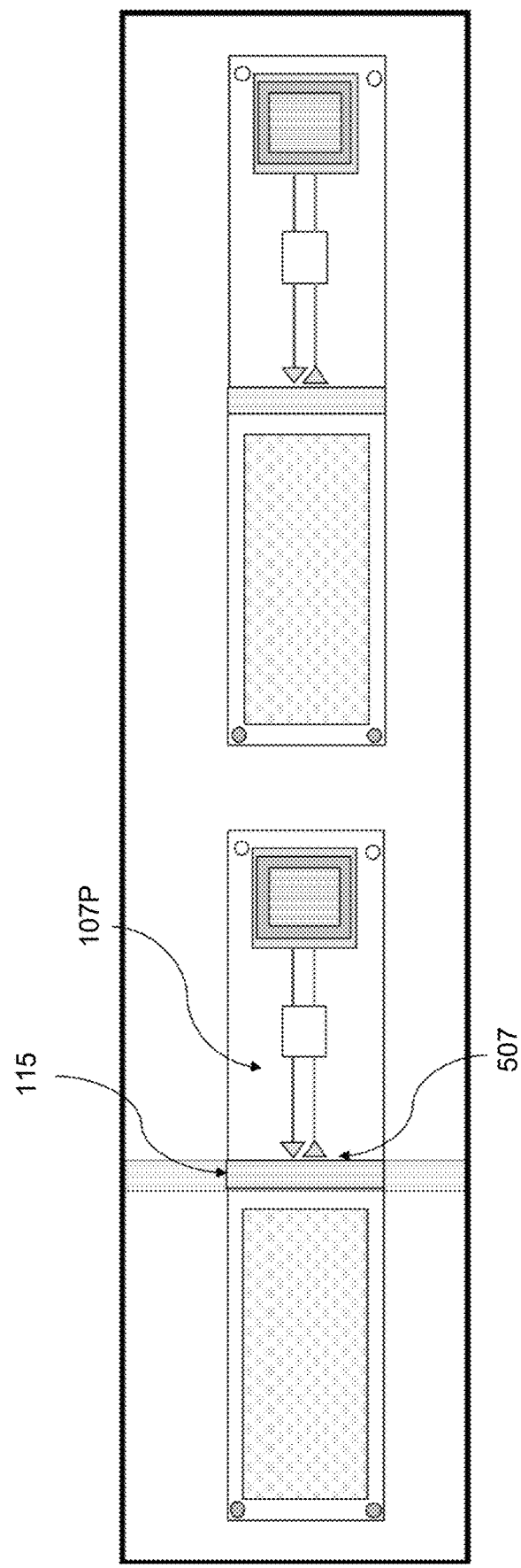
FIG. 6 is a top view of a cooling unit integrated with several cooling devices in a particular configuration according to one embodiment.

FIG. 6 is a top view of a cooling unit integrated with several cooling devices in a particular configuration according to one embodiment. As shown in FIG. 6, cooling device 107P is assembled to mounting structure 115. Cooling device 107P can be a variation of cooling device 107 of FIG. 5, except that cooling device 107P is folded along a length adjacent to liquid connectors of cooling device 107P. Such a cooling device design variation can accommodate different server system configurations. In one embodiment, a liquid distribution channel is situated along a length of mounting structure 115 (e.g., overlaps mounting structure 115). In some embodiments, cooling device 107P can have different form factors, such as a full height full length, full height half length, and so forth.

Figure 7:
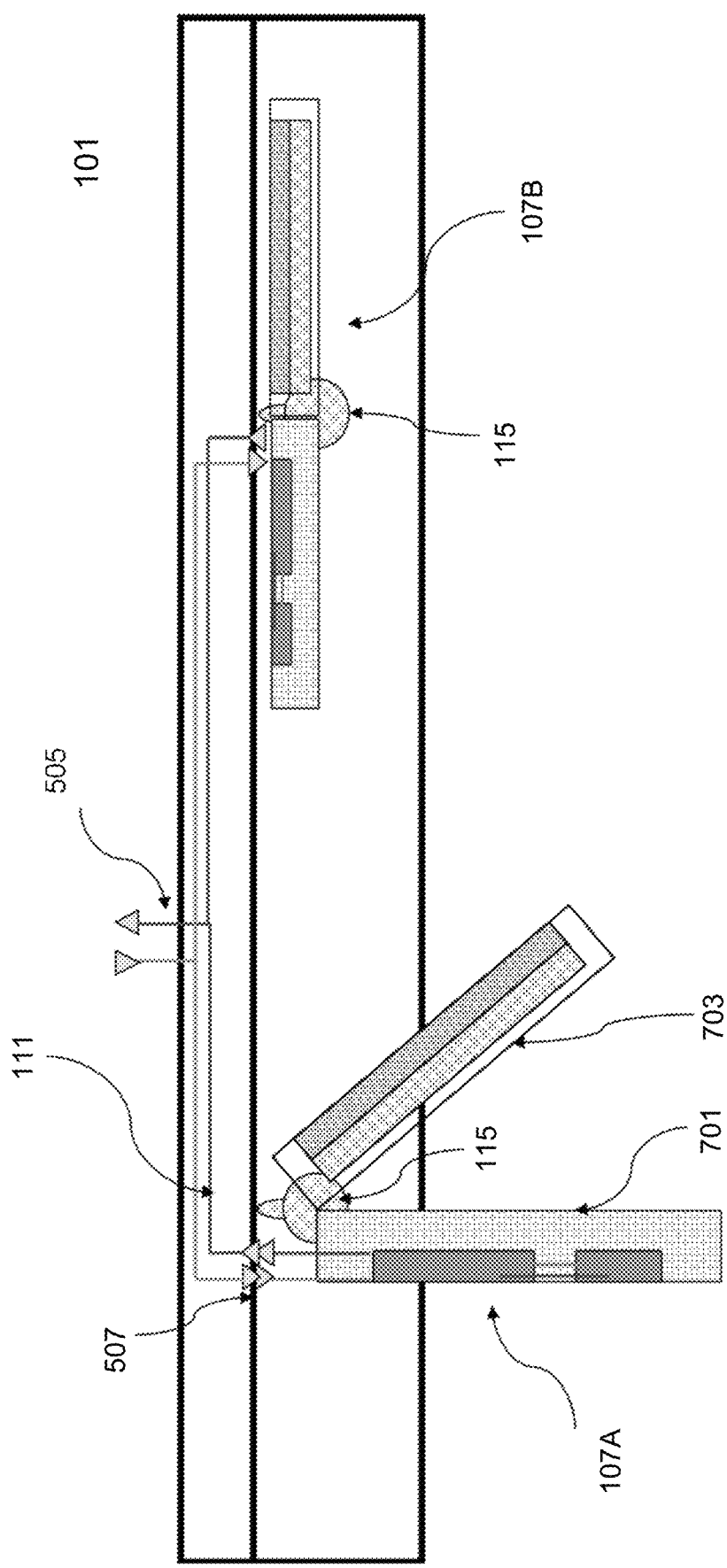
FIG. 7 is a side view of a cooling unit illustrating a cooling device folded onto a mounting structure according to one embodiment.

FIG. 7 is a side view of a cooling unit 101 illustrating a cooling device folded onto a mounting structure according to one embodiment. As shown in FIG. 7, cooling unit 101 includes cooling device 107A that is partially closed and cooling device 107B that is fully open. Cooling device 107A can include planar portions 701-703. Portion 701 and portion 703 can be two separate parts or can be an integrated unit, where portion 701 can fold onto portion 703. In one embodiment, portion 701 can fold onto portion 703 with a mounting structure (such as mounting structure 115) clamped in between the fold. In one embodiment, portion 701 includes a cold plate and liquid distribution channels to distribution a cooling liquid through the cold plate, and portion 703 includes a blank panel.

Referring to FIG. 7, in one embodiment, cooling unit 101 includes one or more liquid distribution channels 111, where the one or more liquid distribution channels 111 are integrated within a structural layer of cooling unit 101. Channels 111 can include cooling and/or a warm liquid loops/hoses. Channels 111 can include main connector ports 505 to interface with a fluid distribution system, such as that provided by a rack manifold of an electronic rack to distribution cooling fluid to cooling devices 107. In one embodiment, channels 111 includes predesigned ports or liquid connectors 507 to interface with cooling devices 107. As shown, liquid distribution channels 111 can completely integrate the liquid distributing and management functionalities within a layer of cooling unit 101.

Figure 8:
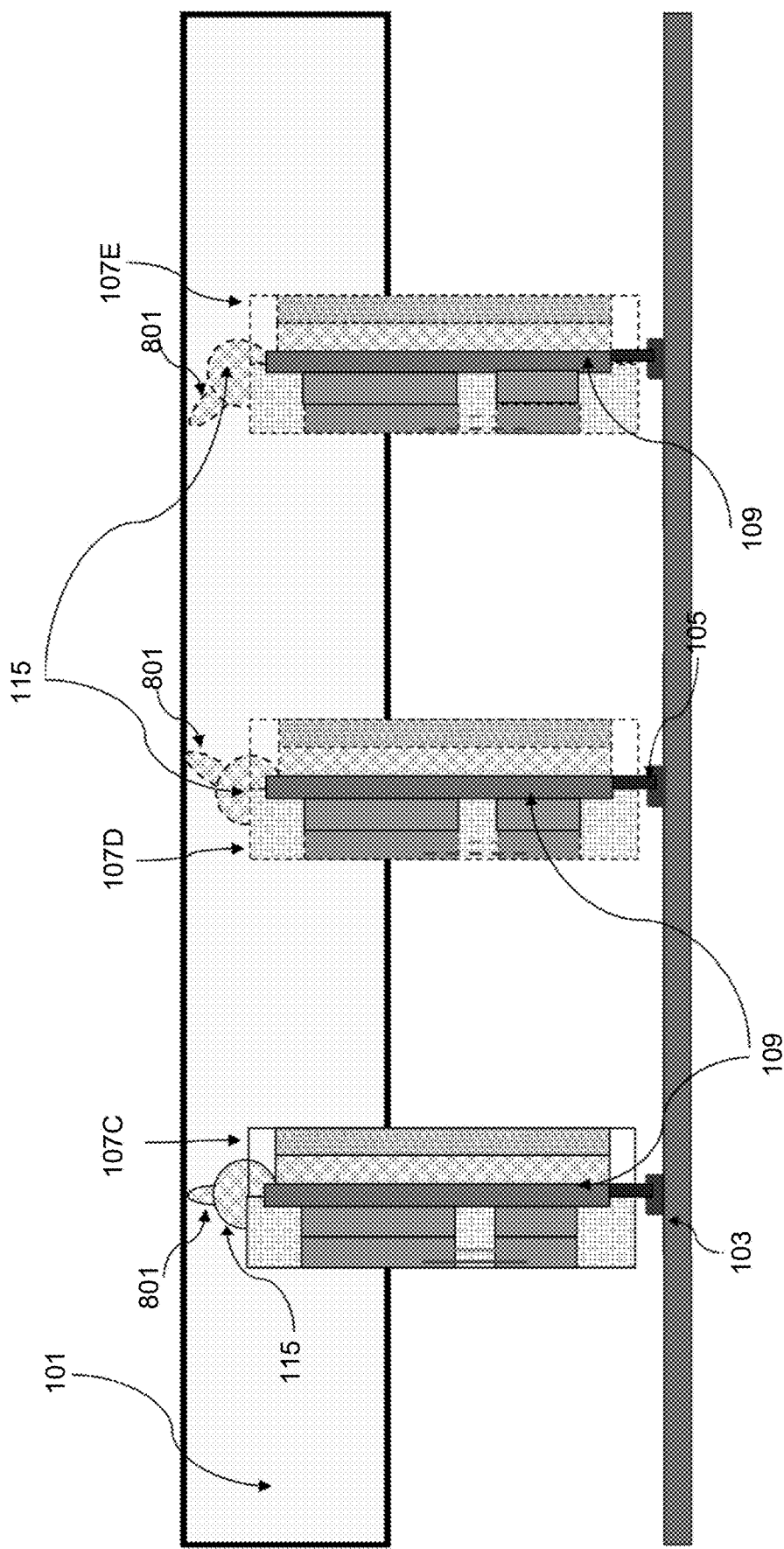
FIG. 8 is a side view of a cooling unit illustrating a mounting structure with a flexible extension according to one embodiment.

FIG. 8 is a side view of a cooling unit illustrating a mounting structure with a flexible extension according to one embodiment. As shown in FIG. 8, mounting structure 115 can include a flexible extension 801. In one embodiment, flexible extension 801 can flexibly extend mounting structure 115 with a 360-degree freedom, thereby allowing a cooling device that is mounted to mounting structure 115 be relocated by a predetermined distance. Flexible extension 801 can provide cushion and stress offset to peripheral slots 105, where a peripheral connection is made between peripheral device PCB 109 and a main PCB board 103. In one embodiment, flexible extension 801 can include a ball and socket pivot mechanism, a flexible arm/spring mechanism, or any other flexible extension mechanisms.

As shown in FIG. 8, cooling device 107C is directly aligned to a peripheral device PCB 109, via mounting structure 115. Cooling device 107D is extended to a left, and cooling device 107E is extend to a right, via flexible extensions 801 of mounting structures 115. The extension can eliminate a stress which may be loaded onto peripheral slots 105 since positions of mounting structures 115 may not perfectly align with peripheral slots 105.

Figure 9:
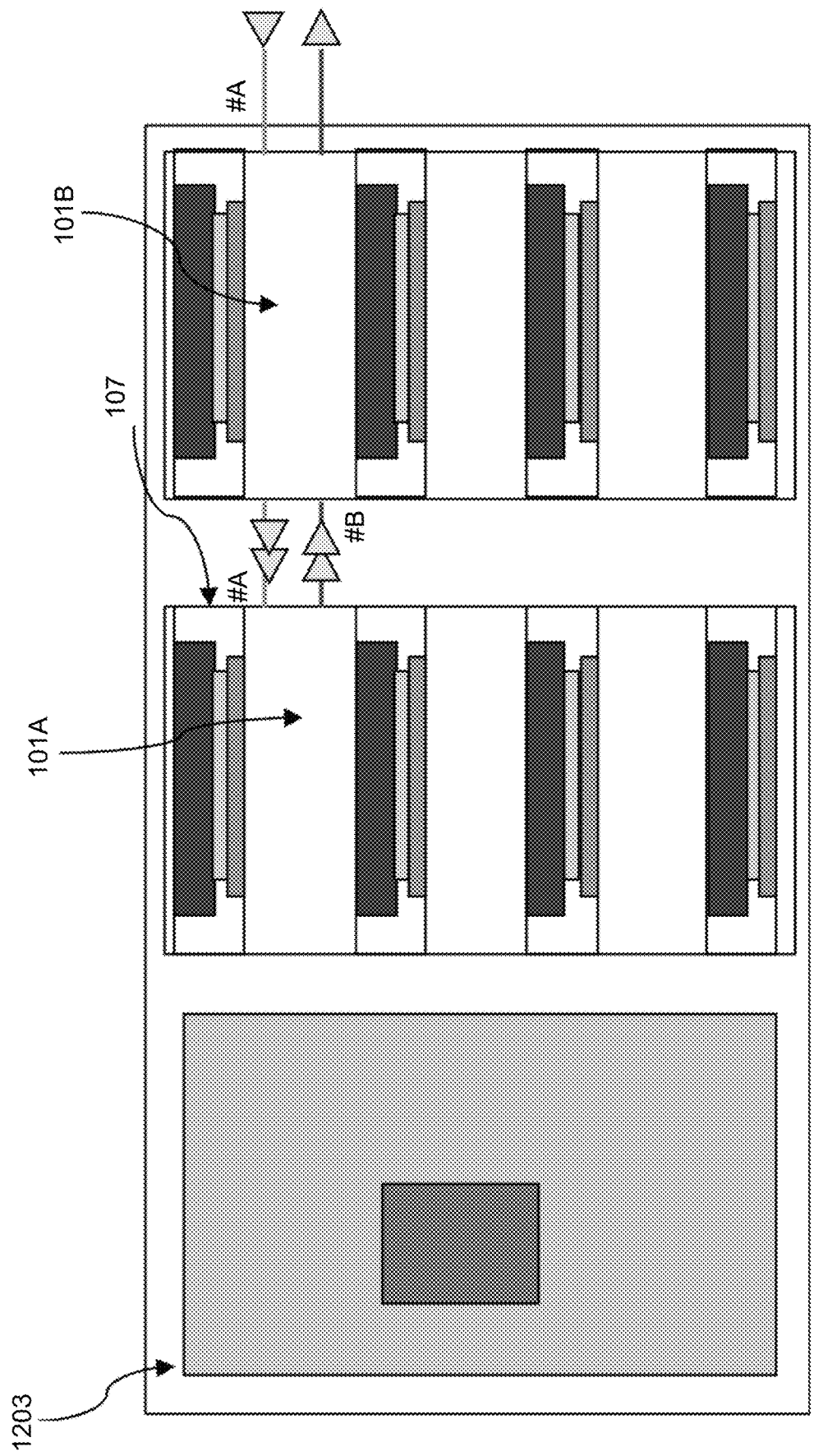
FIG. 9 is a top view of a server system illustrating one or more cooling units coupled in a series arrangement according to one embodiment.
Figure 10:
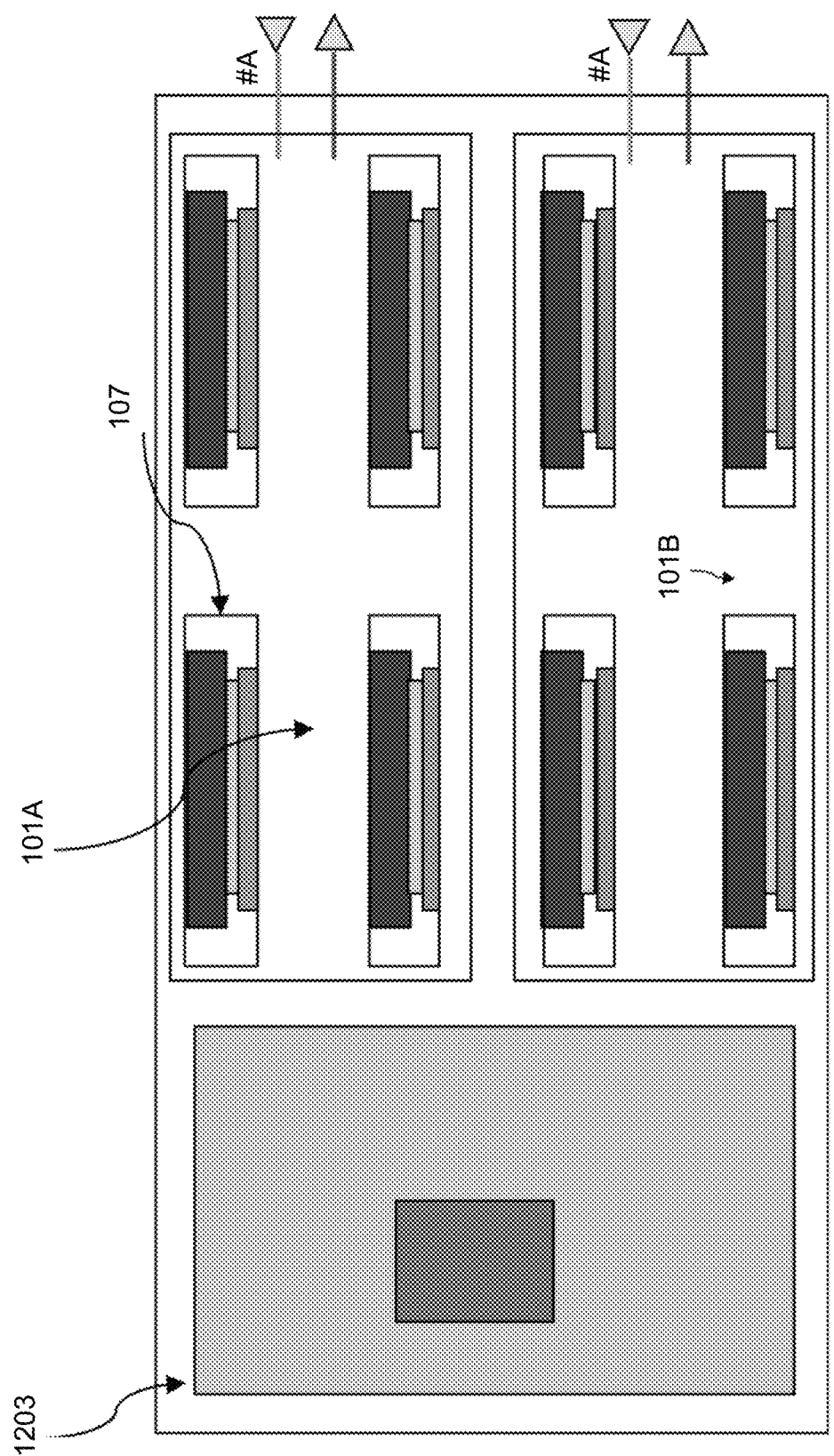
FIG. 10 is a top view of a server system illustrating one or more cooling units coupled in a parallel arrangement according to one embodiment.

As describe earlier, cooling units 101 are modular units which can be arranged in various manners to support different server chassis configurations. FIGS. 9-12 illustrate some example arrangements. FIGS. 9 and 10 show variations of a cooling unit design enable to accommodate different server chassis configurations.

FIG. 9 is a top view of a server system illustrating one or more cooling units coupled in a series arrangement according to one embodiment. FIG. 9 shows a server chassis 1203 with eight peripheral devices (or expansion cards), where each peripheral device is assembled to a cooling device 107. Four cooling devices 107 are then assembled to a cooling unit 101A-B.

As shown in FIG. 9, a first cooling unit 101A is used to assemble a first row of cooling devices 107 and a second cooling unit 101B is used to assemble a second row of cooling devices 107. First cooling unit 101A has liquid distribution connections (such as port #A) coupled in series with liquid distribution connections (such as port #B) of second cooling unit 101B. Liquid distribution connections (such as port #A) of second cooling unit 101B can connect to a liquid distribution system external to server chassis 1203.

FIG. 10 is a top view of a server system illustrating one or more cooling units coupled in a parallel arrangement according to one embodiment. FIG. 10 shows two separate cooling units 101A-B, where each of cooling units 101A-B is assembled to four cooling devices 107. As shown, cooling units 101A-B are both connected a liquid distribution system external to server chassis 1203 for a parallel liquid distribution to the cooling units 101A-B.

Figure 11:
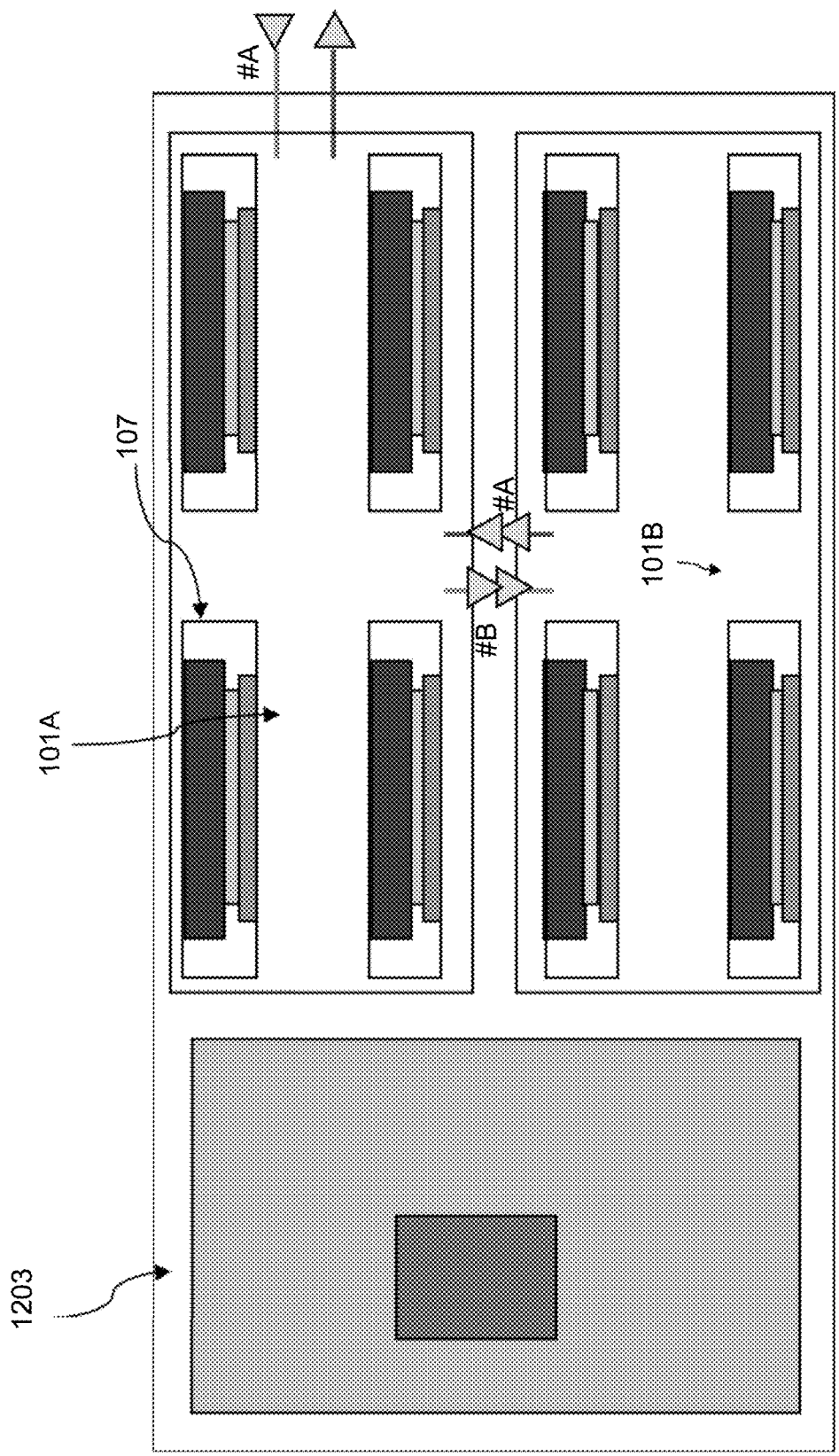
FIG. 11 is a top view of a server system illustrating one or more cooling units coupled in a series arrangement according to one embodiment.

FIG. 11 is a top view of a server system illustrating one or more cooling units coupled in a series arrangement according to one embodiment. FIG. 11 shows cooling units 101A-B are connected in series, but port #B of cooling unit 101A is situated on a side adjacent to a side of port #A of cooling unit 101A. Cooling unit 101A port #A is connected a liquid distribution system external to server chassis 1203.

Figure 12:
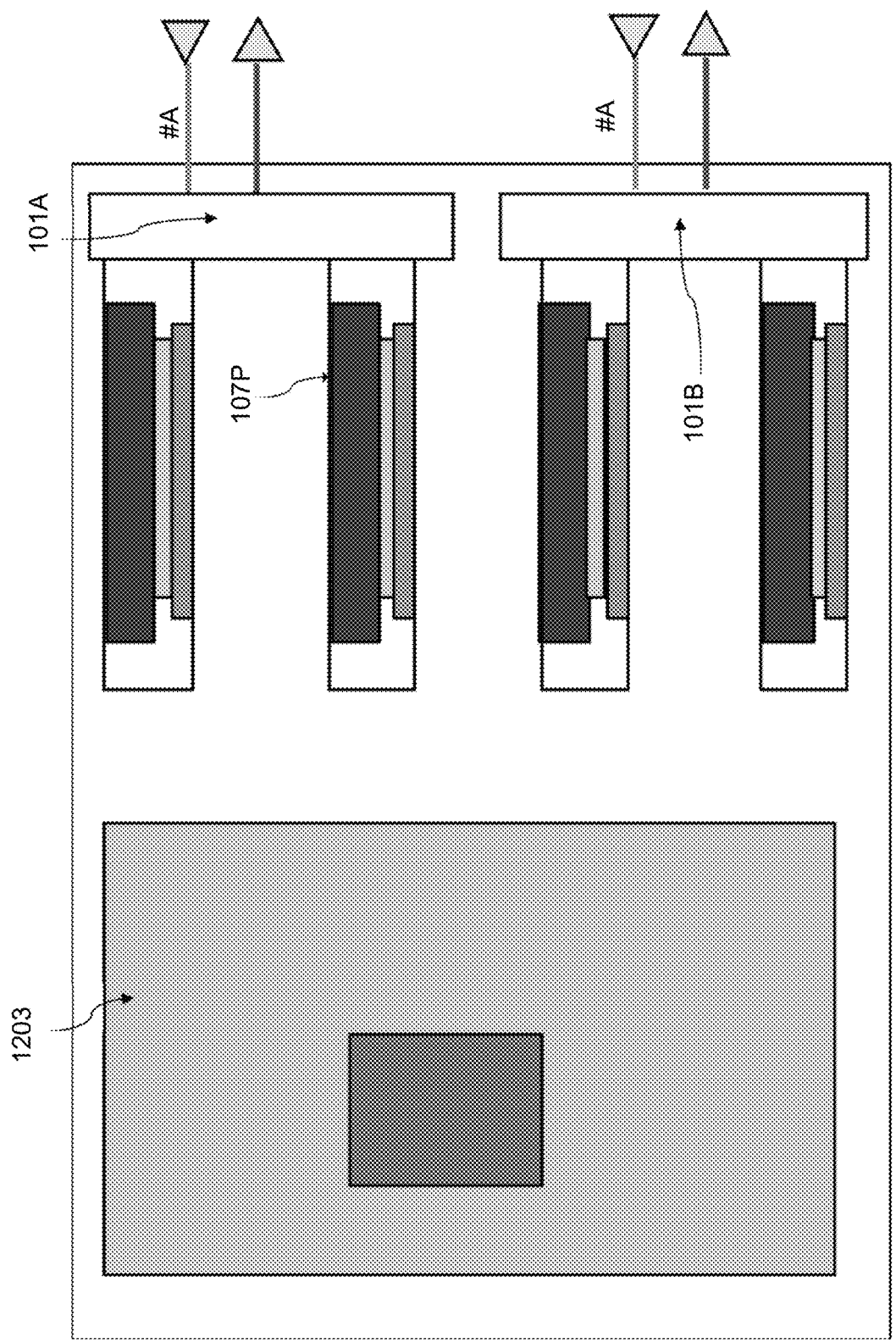
FIG. 12 is a top view of a server system illustrating one or more cooling units coupled in a particular arrangement according to one embodiment.

FIG. 12 is a top view of a server system illustrating one or more cooling units coupled in a particular arrangement according to one embodiment. In one embodiment, two cooling units 101A-B are secured to server chassis 1203. As shown in FIG. 12, cooling units 101A-B can be implemented to a side panel of server chassis 1203, e.g., a surface of cooling units 101A-B is parallel to a side panel of server chassis 1203.

In this case, each of cooling units 101A-B can include one or more cooling devices 107P, e.g., cooling devices 107P as shown in FIG. 6. In some embodiments, cooling devices 107P has liquid connectors fixed to cooling units. It can be seen that different system implementation and configurations can be realized using the modular design of cooling units 101, to support different types of peripheral cards at various locations on a main PCB board.

Figure 13:
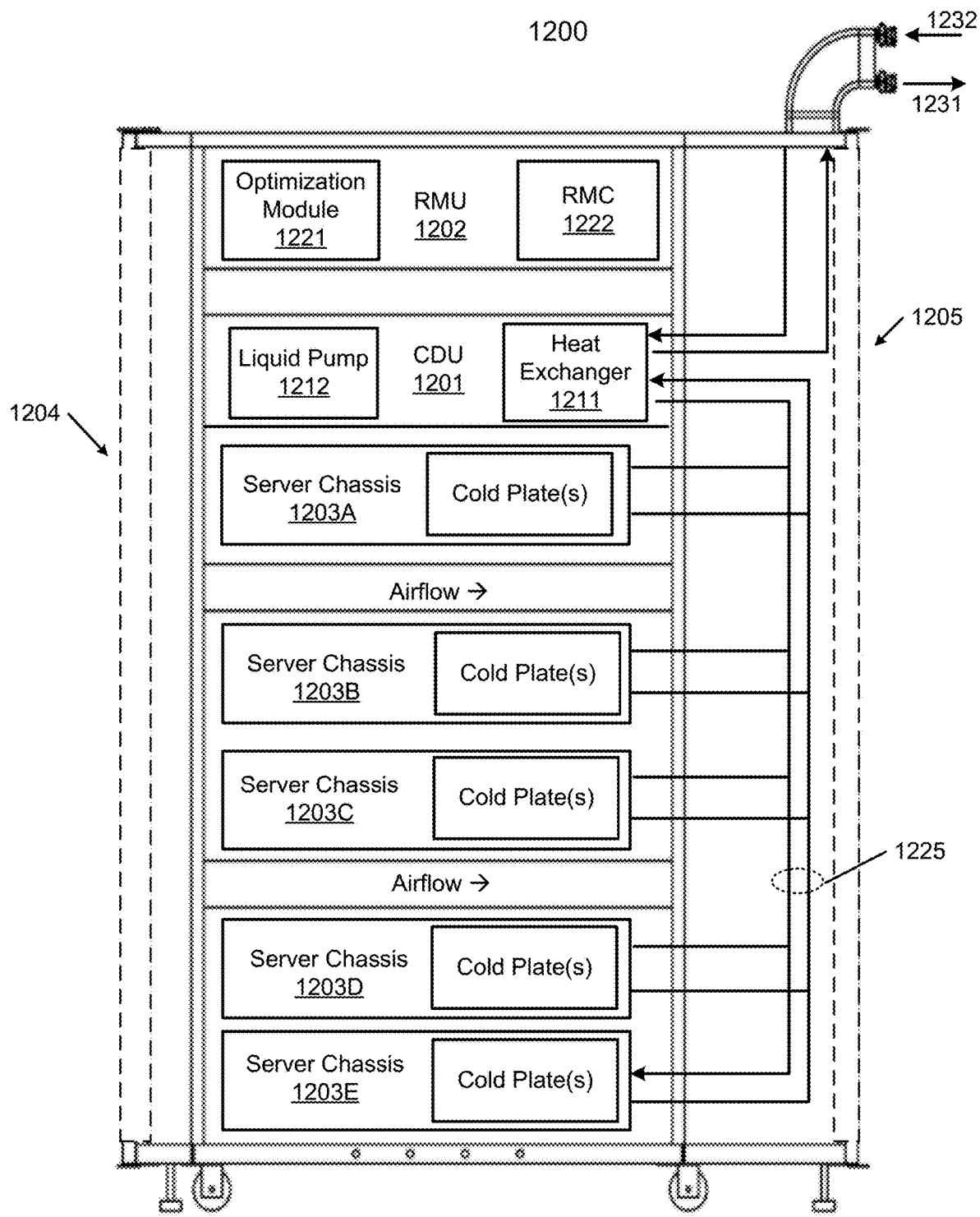
FIG. 13 is a block diagram illustrating an electronic rack according to one embodiment.

FIG. 13 is block diagram illustrating an electronic rack according to one embodiment. Electronic rack 1200 may represent any of the electronic racks as described throughout this application. According to one embodiment, electronic rack 1200 includes, but is not limited to, coolant distribution unit (CDU) 1201, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of CDU 1201, RMU 1202, and/or server chassis 1203 are shown for the purpose of illustration only; other arrangements or configurations of CDU 1201, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backends of server chassis 1203 or on the electronic rack to generate airflows flowing from frontend 1204, traveling through the air space of the sever chassis 1203, and existing at backend 1205 of electronic rack 1200.

In one embodiment, CDU 1201 mainly includes heat exchanger 1211, liquid pump 1212, and a pump controller (not shown), and some other components such as a liquid reservoir, a power supply, monitoring sensors and so on.

Heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to liquid manifold 1225 (also referred to as a rack manifold) to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to CDU 1201. Note that CDUs 1201 can be any kind of CDUs commercially available or customized ones. Thus, the details of CDUs 1201 will not be described herein.

Each of server chassis 1203 may include a tray secured to server chassis 1203, the tray to contain one or more electronic components. (e.g., central processing units or CPUs, peripheral cards, general/graphic processing units (GPUs), memory, and/or storage devices). Each electronic component may perform data processing tasks, where the electronic component may include software installed in a storage device, loaded into the memory, and executed by one or more processors to perform the data processing tasks. Server chassis 1203 may include a host server (referred to as a host node) and/or one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1200 further includes optional RMU 1202 configured to provide and manage power supplied to servers 1203, and CDU 1201. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 1200.

In one embodiment, RMU 1202 includes optimization module 1221 and rack management controller (RMC) 1222. RMC 1222 may include a monitor to monitor operating status of various components within electronic rack 1200, such as, for example, computing nodes 1203, CDU 1201, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for liquid pump 1212, such that the total power consumption of liquid pump 1212 and the fan modules reaches minimum, while the operating data associated with liquid pump 1212 and cooling fans of the fan modules are within their respective designed specifications. Once the optimal pump speed and optimal fan speeds have been determined, RMC 1222 configures liquid pump 1212 and cooling fans of the fan modules based on the optimal pump speeds and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server chassis 1203. Similarly, based on the optimal fan speeds, RMC 1222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown is described for the purpose of illustration only; other configurations or arrangements may also be applicable. For example, CDU 1201 may be an optional unit. The cold plates of server chassis 1203 may be coupled to a rack manifold, which may be directly coupled to room manifolds 1231-1232 without using a CDU. Although not shown, a power supply unit may be disposed within electronic rack 1200. The power supply unit may be implemented as a standard chassis identical or similar to a sever chassis, where the power supply chassis can be inserted into any of the standard shelves, replacing any of server chassis 1203. In addition, the power supply chassis may further include a battery backup unit (BBU) to provide battery power to server chassis 1203 when the main power is unavailable. The BBU may include one or more battery packages and each battery package include one or more battery cells, as well as the necessary charging and discharging circuits for charging and discharging the battery cells.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling unit, comprising:
   one or more liquid distribution channels to distribute warm liquid to a rack manifold of an electronic rack and cooling liquid from the rack manifold;
   one or more first mounting structures, wherein the one or more first mounting structures are mounted onto the cooling unit, wherein the one or more first mounting structures are movable along a first direction; and one or more cooling devices mounted to the one or more first mounting structures, wherein each of the one or more cooling devices comprises a liquid cooling plate interfaced to one or more peripheral devices of a server system, wherein the liquid cooling plate is coupled to the one or more liquid distribution channels to receive cooling liquid to cool the one or more peripheral devices and to return warm liquid to the one or more liquid distribution channels; and one or more second mounting structures that are mountable onto the one or more first mounting structures, wherein the one or more first mounting structures are situated at a first plane and the one or more second mounting structures are situated at a second plane different from the first plane, wherein each of the one or more second mounting structures is movable along a length of the one or more first mounting structures, wherein the one or more second mounting structures are mounted, either perpendicular or parallel, onto the length of the one or more first mounting structures.

2. The cooling unit of claim 1, wherein each of the one or more liquid distribution channels overlap one of the one or more first mounting structures.

3. The cooling unit of claim 1, wherein each of the one or more cooling devices are mountable onto the one or more first mounting structures or the one or more second mounting structures.

4. The cooling unit of claim 1, wherein each of the one or more peripheral devices is sandwiched by the one or more cooling devices.

5. The cooling unit of claim 1, wherein the one or more peripheral devices are hot pluggable peripheral devices and a cooling device coupled to a peripheral device is removable from the server system while the server system is in operation.

6. The cooling unit of claim 1, wherein a cooling device includes a first planar portion and a second planar portion, wherein the second planar portion is foldable onto the first planar portion, wherein the cooling device is to fold onto either a first mounting structure or a second mounting structure using the first and second planar portions to secure the cooling device to either the first or second mounting structure.

7. The cooling unit of claim 1, wherein a first or a second mounting structure includes a flexible extension, wherein a peripheral package coupled to the second mounting structure is flexibly extendable to a peripheral slot.

8. The cooling unit of claim 1, wherein the one or more liquid distribution channels is coupled, in parallel or in series, to one or more liquid distribution channels of another cooling unit.

9. A server chassis of an electronic rack, comprising:
a tray secured to the server chassis to contain one or more peripheral devices, wherein the server chassis is stackable in a stack on an electronic rack; and
a cooling unit coupled to the server chassis, comprising:
one or more liquid distribution channels to distribute warm liquid to a rack manifold of an electronic rack and cooling liquid from the rack manifold of the electronic rack;
one or more first mounting structures, wherein the one or more first mounting structures are mounted onto the cooling unit, wherein the one or more first mounting structures are movable along a first direction; and
one or more cooling devices mounted to the one or more first mounting structures, wherein each of the one or more cooling devices comprises a liquid cooling plate interfaced to the one or more peripheral devices, wherein the liquid cooling plate is coupled to the one or more liquid distribution channels to receive cooling liquid to cool the one or more peripheral devices and to return warm liquid to the one or more liquid distribution channels; and
one or more second mounting structures that are mountable onto the one or more first mounting structures, wherein the one or more first mounting structures are situated at a first plane and the one or more second mounting structures are situated at a second plane different from the first plane,
wherein each of the one or more second mounting structures is movable along a length of the one or more first mounting structures, wherein the one or more second mounting structures are mounted, either perpendicular or parallel, onto the length of the one or more first mounting structures.

10. The server chassis of claim 9, wherein each of the one or more liquid distribution channels overlap one of the one or more first mounting structures.

11. The server chassis of claim 9, wherein each of the one or more cooling devices are mountable onto the one or more first mounting structures or the one or more second mounting structures.

12. An electronic rack of a data center, comprising:
a rack manifold having a rack liquid supply line to receive first cooling liquid from a cooling liquid source and a rack liquid return line to return first warmer liquid back to the cooling liquid source;
a plurality of server chassis arranged in a stack, each server chassis comprising:
a tray secured to the server chassis to contain one or more peripheral devices; and
a cooling unit coupled to the server chassis, comprising:
one or more liquid distribution channels to distribute warm liquid to the rack manifold and cooling liquid from the rack manifold;
one or more first mounting structures, wherein the one or more first mounting structures are mounted onto the cooling unit, wherein the one or more first mounting structures are movable along a first direction;
one or more cooling devices mounted to the one or more first mounting structures, wherein each of the one or more cooling devices comprises a liquid cooling plate interfaced to the one or more peripheral devices, wherein the liquid cooling plate is coupled to the one or more liquid distribution channels to receive cooling liquid to cool the one or more peripheral devices and to return warm liquid to the one or more liquid distribution channels; and
one or more second mounting structures that are mountable onto the one or more first mounting structures, wherein the one or more first mounting structures are situated at a first plane and the one or more second mounting structures are situated at a second plane different from the first plane,
wherein each of the one or more second mounting structures is movable along a length of the one or more first mounting structures, wherein the one or more second mounting structures are mounted, either perpendicular or parallel, onto the length of the one or more first mounting structures.

13. The electronic rack of claim 12, wherein each of the one or more liquid distribution channels overlap one of the one or more first mounting structures.

14. The electronic rack of claim 12, wherein each of the one or more cooling devices are mountable onto the one or more first mounting structures or the one or more second mounting structures.

15. The server chassis of claim 9, wherein each of the one or more peripheral devices is sandwiched by the one or more cooling devices.

16. The server chassis of claim 9, wherein the one or more peripheral devices are hot pluggable peripheral devices and a cooling device coupled to a peripheral device is removable from a server system while the server system is in operation.

17. The server chassis of claim 9, wherein a cooling device includes a first planar portion and a second planar portion, wherein the second planar portion is foldable onto the first planar portion, wherein the cooling device is to fold onto either a first mounting structure or a second mounting structure using the first and second planar portions to secure the cooling device to either the first or second mounting structure.

18. The electronic rack of claim 12, wherein each of the one or more peripheral devices is sandwiched by the one or more cooling devices.

19. The electronic rack of claim 12, wherein the one or more peripheral devices are hot pluggable peripheral devices and a cooling device coupled to a peripheral device is removable from a server system while the server system is in operation.

20. The electronic rack of claim 12, wherein a cooling device includes a first planar portion and a second planar portion, wherein the second planar portion is foldable onto the first planar portion, wherein the cooling device is to fold onto either a first mounting structure or a second mounting structure using the first and second planar portions to secure the cooling device to either the first or second mounting structure.

* * * * *